(12) United States Patent
Fitz et al.

(10) Patent No.: US 6,760,350 B1
(45) Date of Patent: Jul. 6, 2004

(54) METHOD FOR MEASURING GAIN OF PHOTONIC INVERTERS

(75) Inventors: John Leslie Fitz, Baltimore, MD (US); Warren Taylor Beard, Huntingtown, MD (US); Scott Carl Horst, Sykesville, MD (US); Suzanne Dadgar Smith, Millersville, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 217 days.

(21) Appl. No.: 10/063,348

(22) Filed: Apr. 12, 2002

(51) Int. Cl.[7] .................................................. H01S 3/13
(52) U.S. Cl. .............................. 372/29.021; 372/29.02; 372/31
(58) Field of Search ........................ 372/29.02, 29.021, 372/31

(56) References Cited

U.S. PATENT DOCUMENTS

| 5,309,469 A | * | 5/1994 | Koren et al. ................... 372/50 |
| 5,504,772 A | * | 4/1996 | Deacon et al. ............... 372/102 |
| 5,542,010 A | * | 7/1996 | Glance et al. ................. 385/14 |
| 5,828,679 A | * | 10/1998 | Fisher ............................ 372/6 |
| 2003/0072519 A1 | * | 4/2003 | Bolanos ....................... 385/16 |

* cited by examiner

*Primary Examiner*—Paul Ip
*Assistant Examiner*—Leith A Al-Nazer
(74) *Attorney, Agent, or Firm*—Stephen M. Bloor; Robert D. Morelli

(57) ABSTRACT

Method to measure gain of a photonic inverter based on a semiconductor laser using two different modes of operation. In one mode, the device is operated as a photonic inverter device and in the other mode as a photogenerated current measurement device. While the device is operated in a photonic inverter mode, that is, pumped at a magnitude that supports photonic inverter operation, the optical output power is measured in the absence of an input signal and with an input signal that quenches the output of the photonic inverter. While the device is operated as a photogenerated current measurement device with an input optical signal, a reverse bias is applied to offset any forward bias induced by the injected input optical signal, the induced photocurrent is measured, and the wavelength of the input optical signal is measured. From these measurements, the gain is calculated using the difference in the photonic inverter optical output power with and without the optical input signal while operating in photonic inverter mode and the input power responsible for the quench of the photonic inverter while in photogenerated current measurement mode.

4 Claims, 4 Drawing Sheets

METHOD FOR MEASURING GAIN OF PHOTONIC INVERTERS

BACKGROUND OF INVENTION

1. Field of the Invention

This invention relates generally to the measurement of optical power and more particularly to measurement of the gain (or quench ratio) of photonic inverting devices.

2. Description of the Related Art

Photonic integrated circuits (PICs) require inverting logic gates with gain greater than one to enable logic functionality with fanout and cascade. A photonic inverter is a core component within photonic inverting logic gates. Optically modulated semiconductor laser technology is speed-limited by the photon cavity lifetime and, therefore, can provide high speed, integrable, photonic inverters that can be used as digital logic gates. If semiconductor lasers can be configured as photonic inverters with gain exceeding one, then photonic clocks, oscillators and logic gates would be possible at high data rates.

Elements necessary for a viable high-speed photonic logic family are: Boolean completeness, gain greater than one for cascade and fanout, sufficient modulation depth to drive successive logic devices, and a process technology compatible with circuit components and established design tools. From De Morgan's laws, multiple-input inverting gates are sufficient to form a Boolean complete logic family. In an article entitled "Operation Characteristics of A Side-Light-Injection Multiple-Quantum-Well Bistable Laser for All Optical Switching" by Hiroyuki Uenohara et al., published in the Jpn. J. Appl. Phys., vol. 33, pp. 815–821, 1994, a semiconductor laser was demonstrated as a photonic inverter gate using the gain quenching effect, where the output amplitude of the logic laser is suppressed (quenched) when an input signal is present. In this article, input-power data and output-power data are presented that can be used to calculate gain for a photonic inverter based on a semiconductor laser with a side-injection input configuration. The input power measurement documented in this article is measured external to the photonic inverter input port, and neglects insertion losses that degrade the input signal as it propagates from the input port to the active volume of the semiconductor laser where the gain quenching occurs. The method presented in this article for measuring the input power data does not measure the input power responsible for the gain quenching observed. This article does not disclose the present invention. A semiconductor laser inverter with two inputs has the capacity to perform a logical NAND or NOR function.

When developing or evaluating photonic inverter structures, there is a requirement to measure the minimum gain of the photonic inverters as a metric to quantify performance changes of devices as a function of engineering changes between devices or operational parameters. When the devices under measurement are photonic inverters based upon semiconductor lasers with a side-injection input configuration, the physical geometries of the devices involved do not allow for the direct measurement of the internal photonic input signal power responsible for the quenching function of the photonic inverter. One can easily measure the input power incident upon the device input interface, but to design optimal photonic inverter devices, one needs to quantify the input optical power injected within the active volume of the photonic inverter semiconductor laser cavity which is solely responsible for the gain quenching modulation of the laser output power.

The actual power coupled into the laser active region of a photonic inverting device will be less than the total incident input power because of losses associated with scattering, absorption, and transmission. External incident power could be measured with any number of standard optical power measurement techniques but as the associated losses are unknown, the actual power coupled into the photonic inverter laser active region cannot be determined from this measurement. It is this actual power responsible for the quenching interaction that must be accurately characterized for practical design of photonic inverters. Heretofore, prior demonstrations of such measurements have not explicitly considered these losses and have made measurements of the input power external to the actual device at the device input interface. Knowledge of the actual power responsible for the quenching of the photonic inverter is required to optimize the design of the actual physical parameters of the photonic inverter device.

SUMMARY OF INVENTION

In consideration of the problems detailed above and the limitations enumerated in the partial solutions thereto, an object of the present invention is to provide a method for measuring the optical power injected within the active volume of a side-injection input photonic inverter.

Another object of the present invention is to provide a measurement method that does not include errors introduced by various insertion losses.

Yet another object of the present invention is to provide a method that yields a value for maximum injected optical input power that can be used to evaluate the minimum gain associated with operation of a photonic inverter.

In order to attain the objectives described above, according to an aspect of the present invention, there is provided a method for measuring gain of a photonic inverter whereby the input optical signal power is determined by the measured photocurrent induced by the side-injected input optical signal, and the output power of the photonic inverter is measured by standard techniques.

The present invention is a method to measure gain of a side-injection input photonic inverter based on a semiconductor laser using two different modes of operation. In one mode, the device is operated as a photonic inverter device and in the other mode as a photogenerated current measurement device.

While the device is operated in a photonic inverter mode, that is, pumped at a magnitude that supports photonic inverter operation, the optical output power is measured in the absence of an input signal and with an input signal that quenches the output of the photonic inverter. While the device is operated as a photogenerated current measurement device with an input optical signal, a reverse bias is applied to offset any forward bias induced by the injected input optical signal, the induced photocurrent is measured, and the wavelength of the input optical signal is measured. From these measurements, the gain is calculated using the difference in the photonic inverter optical output power with and without the optical input signal while operating in photonic inverter mode and the input power responsible for the quench of the photonic inverter while in photogenerated current measurement mode.

BRIEF DESCRIPTION OF DRAWINGS

The present invention can best be understood when reading the following specification with reference to the accompanying drawings, which are incorporated in and form a part of the specification, illustrate alternate embodiments of the present invention, and together with the description, serve to explain the principles of the invention. In the drawings.

DETAILED DESCRIPTION

The present invention is a method for measuring the gain of a photonic inverter. This method will work with any semiconductor laser-based photonic inverter. For clarity, we will describe the gain measurement method as used to measure gain using a ridge semiconductor laser as an exemplar.

Figure 1:
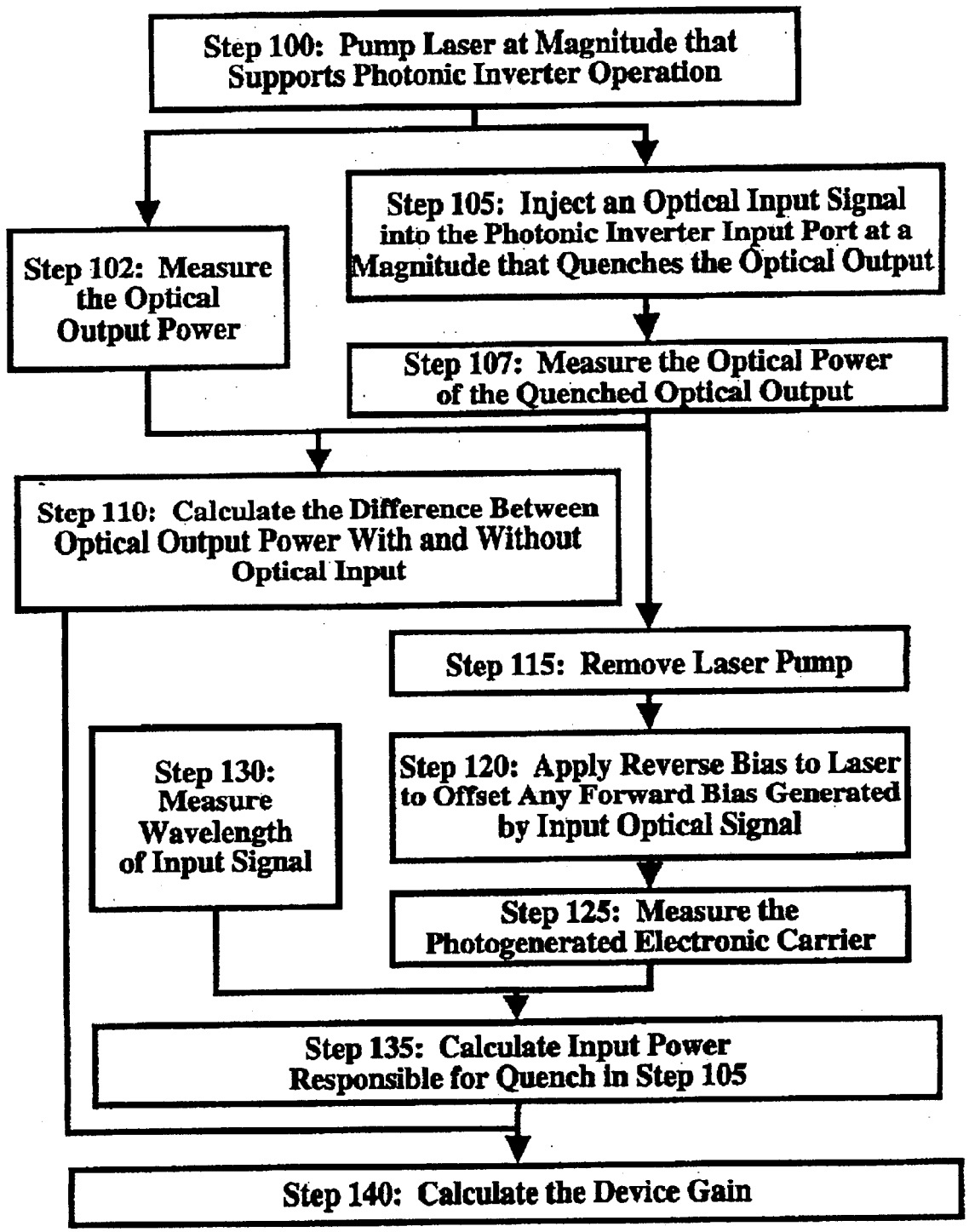
FIG. 1 is a flow chart showing the steps of the method for measuring the gain of photonic inverters.
Figure 2:
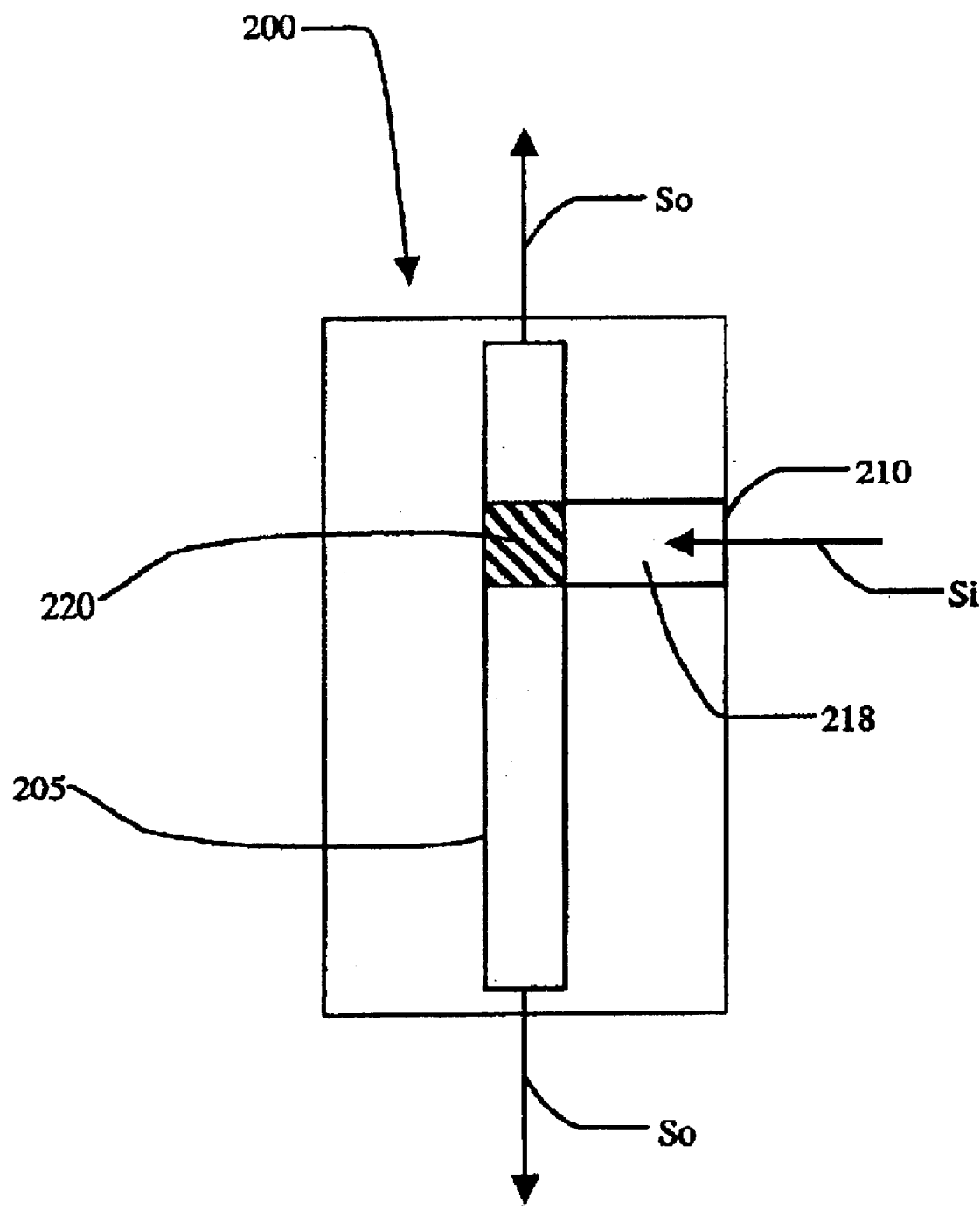
FIG. 2 is a diagram showing an exemplar side-injection photonic inverter.
Figure 4:
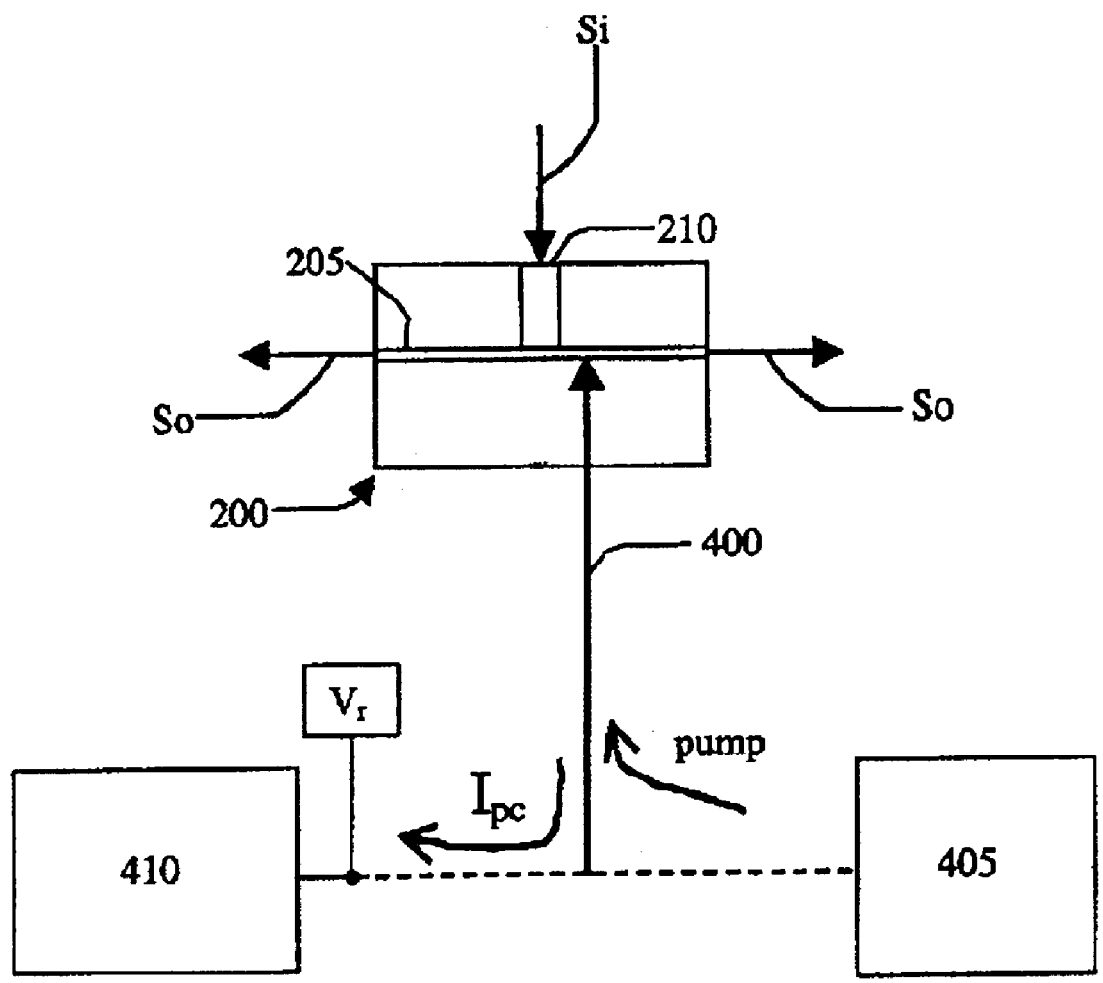
FIG. 4 is a diagram showing the typical measurement setup.

FIG. 1 is a flow chart of the steps describing the present invention. The first step 100 of the present method is to pump the optically active material of a photonic inverter laser at a magnitude that supports photonic inverter operation. This may be accomplished through several well-known methods, including optical pumping (photopumping) or current injection. Typical exemplar devices, such as the ridge semiconductor laser 200 (laser 200) shown in FIG. 2, use electrical contacts (not shown) attached to the ridge 205 to accomplish this pumping by way of current injection. FIG. 4 shows a typical set up for measuring photonic inverter gain. In FIG. 4, the current injection source (laser pump) 405 for step 100 is connected to ridge 205 by an electrical probe 400.

In step 102 the output optical power, $S_o$, of the ridge semiconductor laser 200 is measured, without an input signal, $S_i$. This measured optical power is $S_{o1}$. An optical power meter may be used to measure the optical power, $S_{o1}$. Any other suitable optical power measurement method may be used to measure $S_{o1}$.

In step 105, an optical input signal, $S_i$, is injected into a photonic inverter input port 210 (input port 210). With a single input port 210 the laser 200 can be used as a logic inverter, with multiple input ports 210 the laser 200 can be configured as either a NAND or NOR logic gate. The light is moved from one or more input ports 210 via one or more waveguide structures 218, which may be active or passive, to one or more interaction volumes 220. Within an interaction volume 220, the input signals, $S_i$, deplete pumped active material that normally would contribute to the laser output signal, $S_o$, if the input signals, $S_i$, were not present. This depletion of pumped active material by the input signals, $S_i$, causes corresponding quenches in the laser optical output, $S_o$, thereby causing the laser 200 to operate in a photonic inverter mode. The input signals, $S_i$, may be conducted to the interaction volume 220 via other techniques, such as, free space propagation, optical fiber transmission, or other suitable means.

The next step, 107, is to measure the optical power, $S_o$, of the quenched optical output of laser 200. This measured quenched optical output power is $S_{o2}$-$S_{o2}$ can be measured using the same techniques described in step 102.

Step 110, which can be performed after completing steps 102 and 107, is to calculate the amplitude of the photonic inverter optical output signal that has been quenched, $\Delta P_o$, as a result of the presence of the optical input signals, $S_i$, where $\Delta P_o$ is equal to $S_{o1}$ minus $S_{o2}$.

Step 115 is to remove the laser pump 405, described in step 100, without changing the input optical signals, $S_i$, which are present at the input port 210.

Step 120 is to apply a reverse bias, $V_r$ in FIG. 4, to the laser 200 ridge 205 to offset any forward bias induced in the photonic inverter device (laser 200 in the exemplar) by the injected input optical signal, $S_i$. Forward bias occurs under optical illumination via the photovoltaic effect. If the reverse bias applied during photocurrent measurement is too large, then the measurement will overestimate the optical power present in the active volume due to the injected input optical signal, $S_i$. If the reverse bias applied during photocurrent measurement is too small, then the measurement will underestimate the optical power present in the active volume due to the injected input optical signal, $S_i$. For purposes of gain measurement, it is better to slightly overestimate the magnitude of the input signal optical power. This can be done consistently if the applied reverse bias is only enough to offset the slight forward bias induced by the input signal via the photovoltaic effect.

In other preferred methods the applied bias voltage may be forward biased or no bias may be applied. To accurately sample the photogenerated carriers (due to $S_i$) that are present in the active layers that contribute to quenching it may be necessary to use a bias that is not reversed. The epitaxial layer structure 300 varies with application and the required bias is dependent on this layer structure (See FIG. 3). With some epitaxial layer structure 300 reverse bias may overestimate the power of the input signal, Si, because of spatial overlap of input optical signal, $S_i$, with the active layers 305 contained within the epitaxial layer 300 versus the surrounding, typically undoped, layers 302.

Step 125 is to operate the laser 200 in a photogenerated current measurement mode to measure the photogenerated electronic carriers (photocurrents), $I_{pc}$. In the exemplar case this is accomplished by connecting the ridge 205 to a current probe 410 via electrical probe 400 and measuring the photogenerated current, ($I_{pc}$ in FIG. 4). In cases where the laser pump was accomplished optically, then a transparent contact to the ridge 205 may be required to extract the photocurrent $I_{pc}$.

Step 130 is to measure the wavelength, $\lambda_{in}$, of the input optical signal, $S_i$.

Step 135, which can be performed after steps 125 and 130, is to use the expression $$\Delta P_{in}=I_{pc}[(hc)/\lambda_{in}q)]$$

to calculate the input power ($\Delta P_{in}$) responsible for the quench calculated in step 110, where h is Planck's constant, c is the velocity of light in vacuum, and q is electron charge.

The next step 140 is to calculate the gain (G) using $G=\Delta P_o/\Delta P_{in}$. As outlined in FIG. 1, the measurement of photonic inverter gain is a process requiring two different modes of operation for laser 200. One mode is as a photonic inverter device. The other mode is as a photogenerated current measurement device.

Figure 3:
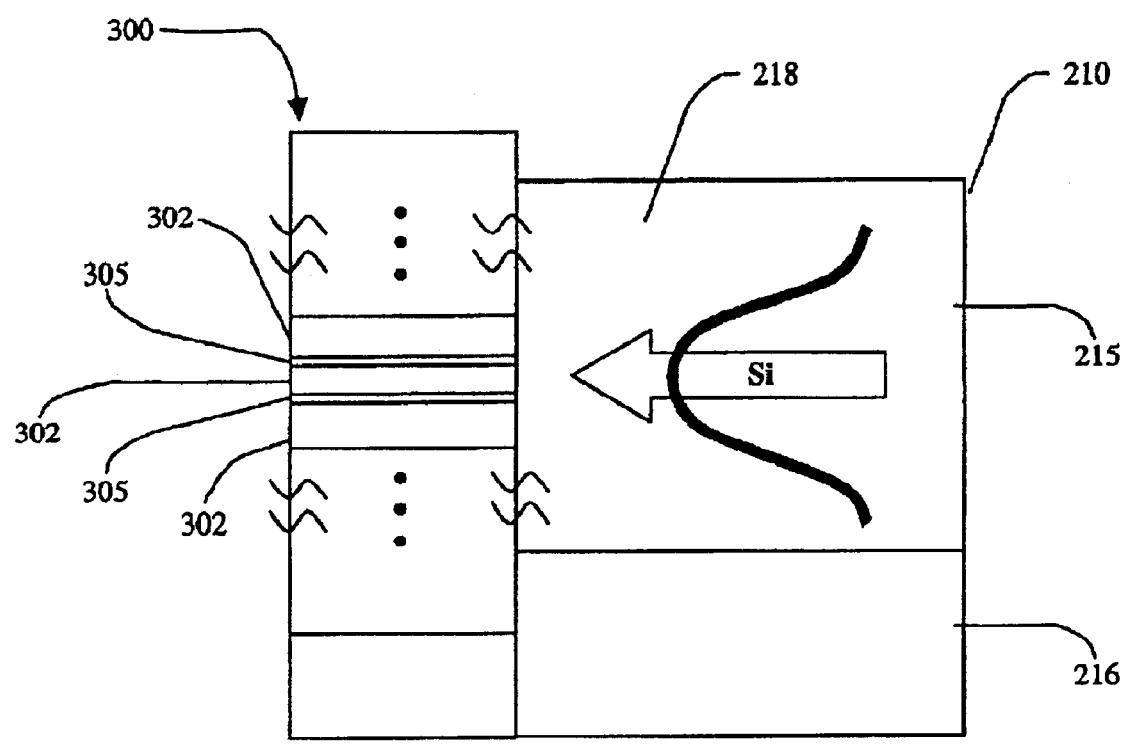
FIG. 3 is a diagram showing the overlap of the injected optical field with the photonic inverter epitaxial layers responsible for quenching.

FIG. 3 is a cross-sectional view of the epitaxial layer structure 300 contained within ridge 205 and input waveguide structure 218 containing guiding layer 215 and buffer layer 216. The cross-section of waveguide structure 218 is shown with guiding layer 215 and buffer layer 216, but any suitable waveguide structure will work. Within the epitaxial layer structure 300 is contained one or more active layers 305 where optical emission and quenching take place within laser 200. FIG. 3 shows two active layers, but any suitable number of active layers may be used. When laser 200 is operated as a photonic inverter, the input signal $S_i$ is interacting only with active layers 305 to cause a quench in output signal, $S_o$. When laser 200 is operating in photogenerated current measurement mode, then the input signal, $S_i$, is absorbed within the active layers 305 and the surrounding, typically undoped, layers 302 to contribute to step 125 where the photogenerated current is measured. The extent of the cross-sectional area of the epitaxial layer structure 300 that contribute to step 125 is dependent upon the value of reverse bias chosen during step 120. In general, the larger a value of reverse bias chosen for step 120, the larger the value of photogenerated current measured in step 125. If the value of reverse bias chosen in step 120 is equal in magnitude to the photon energy of input signal, $S_i$, then forward bias of the epitaxial layer structure 300 by input signal, $S_i$, due to the photovoltaic effect can be offset. For example, if the input signal, $S_i$, has an energy of 1.45 electron-Volts, then a reverse bias, $V_r$, of 1.45 Volts will offset any forward bias of the epitaxial layer structure 300 due to input signal, $S_i$.

As shown in FIG. 3, the spatial extent of the input signal, $S_i$, within waveguide structure 218 is typically much larger than the cross-section of the active layers 305. When $S_i$ is spatilly wider than the active layer thickness, $\Delta P_{in}$ as measured above is a maximum value, and hence, G as measured by this method is a minimum value.

Although various preferred embodiments of the present invention have been described herein in detail to provide for complete and clear disclosure, it will be appreciated by those skilled in the art, that variations may be made thereto without departing from the spirit of the invention or the scope of the appended claims.

What is claimed is:

1. A method of measuring a gain in a photonic device, having at least one input, and having an iverted output, comprising the steps of:
    a. forming the photonic device with a semiconductor laser, where the semiconductor laser has at least one input, has an output, and has at least one optically active material;
    b. pumping the at least one optically active material of the semiconductor laser to a magnitude that supports the inverted output of the photonic device;
    c. measuring a first power $S_{o1}$ at the inverted output of the photonic device;
    d. applying at least one optical signal to corresponding at least one input of the photonic device, where the at least one optical signal is at a magnitude to just quench the inverted output of the photonic device;
    e. measuring a second power $S_{o2}$ at the inverted output of the photonic device;
    f. discontinuing pumping the at least one optically active material of the semiconductor laser;
    g. applying a bias voltage to the semiconductor laser at a magnitude to just offset a bias, if any, induced in the photonic device by the at least one optical signal;
    h. measuring a photocurrent $I_{pc}$, if any, in the semiconductor laser;
    i. measuring a wavelength $\lambda_{in}$ of the at least one optical input signal; and
    j. calculating gain in the photonic device as $G=(S_{o1}-S_{o2})/[I_{pc}hc/\lambda_{in}q]$, where h is Planck's constant, c is the speed of light in a vacuum, and where q is a charge on an electron.

2. The method of claim 1, wherein said step of configuring the photonic device using a semiconductor laser is comprised of the step of configuring the photonic device using a semiconductor laser, where the semiconductor laser has at least one input selected from the group of inputs consisting of a waveguide, an optical fiber, an input that employs free space propagation, any other suitable input, any other equivalent input, and any combination thereof.

3. The method of claim 1, wherein said step of pumping the at least one optically active material of the semiconductor laser is comprised of the step of pumping the at least one optically active material of the semiconductor laser using a pumping method selected from the group of pumping methods consisting of optical pumping, current injection, any other suitable pumping method, and any equivalent pumping method.

4. The method of claim 1, wherein said step of applying a bias voltage to the semiconductor laser is comprised of the step of applying a bias voltage to the semiconductor laser that is selected from the group of bias voltages consisting of a forward bias voltage and a reverse bias voltage.

* * * * *